(12) United States Patent
Kondoh et al.

(10) Patent No.: US 7,527,918 B2
(45) Date of Patent: May 5, 2009

(54) PATTERN FORMING METHOD AND METHOD FOR MANUFACTURING A SEMICONDUCTOR DEVICE

(75) Inventors: Takehiro Kondoh, Yokohama (JP); Eishi Shiobara, Yokohama (JP); Tomoyuki Takeishi, Kawasaki (JP); Kenji Chiba, Tokyo (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 473 days.

(21) Appl. No.: 10/992,349

(22) Filed: Nov. 19, 2004

(65) Prior Publication Data

US 2005/0130068 A1   Jun. 16, 2005

(30) Foreign Application Priority Data

Nov. 21, 2003   (JP)   ............................. 2003-393038

(51) Int. Cl.
  *G03F 7/00* (2006.01)
(52) U.S. Cl. ...................... 430/312; 430/313; 430/394; 430/5; 430/30; 430/323
(58) Field of Classification Search ............ 430/5, 430/397, 323, 313, 394, 328, 330, 396, 30
  See application file for complete search history.

(56) References Cited

U.S. PATENT DOCUMENTS

| | | | |
|---|---|---|---|
| 4,931,351 A * | 6/1990 | McColgin et al. ........... 430/323 |
| 5,906,911 A * | 5/1999 | Cote .......................... 430/316 |
| 6,319,853 B1 | 11/2001 | Ishibashi et al. |
| 6,579,657 B1 * | 6/2003 | Ishibashi et al. ......... 430/270.1 |
| 6,617,096 B2 * | 9/2003 | Burkhard ................... 430/314 |
| 2004/0043305 A1 * | 3/2004 | Park et al. ...................... 430/5 |

FOREIGN PATENT DOCUMENTS

CN   1350205 A   5/2002

(Continued)

OTHER PUBLICATIONS

Notification of the First Office Action from the Chinese Intellectual Property Office, dated Jun. 16, 2006, in counterpart Chinese Patent Application No. 2004-100915685.

(Continued)

*Primary Examiner*—Mark F Huff
*Assistant Examiner*—Caleen O Sullivan
(74) *Attorney, Agent, or Firm*—Finnegan, Henderson, Farabow, Garrett & Dunner, L.L.P.

(57) ABSTRACT

A pattern forming method comprises forming a first resist pattern on a substrate, irradiating light on the first resist pattern, forming a resist film including a cross-linking material on the substrate and the first resist pattern, forming a second resist pattern including a cross-linking layer formed at an interface between the first resist pattern and the resist film by causing a cross-linking reaction at the interface, and irradiating light on the first resist pattern including setting an amount of the light irradiated on the first resist pattern such that a dimension of the second resist pattern is to be a predetermined dimension based on a previously prepared relationship between a difference between a dimension relating to the first resist pattern and a dimension relating to the second resist pattern and the amount of the light irradiated on the first resist pattern.

6 Claims, 7 Drawing Sheets

FOREIGN PATENT DOCUMENTS

| | | | |
|---|---|---|---|
| JP | 10-73927 | | 3/1998 |
| JP | 2000-40656 | | 2/2000 |
| JP | 3071401 | | 5/2000 |
| JP | 3189773 | | 5/2001 |
| JP | 2002-134379 | * | 5/2002 |

OTHER PUBLICATIONS

Notification of Reasons for Rejection from the Japanese Patent Office, mailed Nov. 20, 2007, in Japanese Patent Application No. 2003-393038 and English translation thereof.

* cited by examiner

PATTERN FORMING METHOD AND METHOD FOR MANUFACTURING A SEMICONDUCTOR DEVICE

CROSS-REFERENCE TO RELATED APPLICATIONS

This application is based upon and claims the benefit of priority from prior Japanese Patent Application No. 2003-393038, filed Nov. 21, 2003, the entire contents of which are incorporated herein by reference.

BACKGROUND OF THE INVENTION

1. Field of the Invention

The present invention relates to a pattern forming method for forming a fine resist pattern and a method for manufacturing a semiconductor device.

2. Description of the Related Art

In recent years, with high integration of semiconductor devices, wires and isolation widths have become extremely small. Generally, the fine pattern formation process includes a step of forming a resist pattern on a substrate to be processed using photolithography techniques, and then a step of etching the substrate using the resist pattern as a mask. Thus, photolithography technology is important in the fine pattern formation process.

The dimensions of the resist pattern are limited by the exposure wavelength. On the other hand, in recent years, the dimensions of the fine pattern have been approaching the level of the exposure wavelength. Consequently, the formation of the resist pattern necessary for forming this type of fine pattern is becoming difficult.

So, as a method for forming a fine resist pattern which overcomes the limitation of wavelength, a shrink process is proposed (Japanese Patent No. 3071401, Japanese Patent No. 3189773, and Jpn. Pat. Appln. KOKAI Publication No. 2002-134379). The shrink process comprises forming a cross-linking material on the substrate to be processed and on the resist pattern, thereafter, causing a cross-linking reaction at an interface of the resist film and the resist pattern, thereby growing a cross-linking layer at the interface and forming a fine resist pattern which overcomes the limitation of wavelength and includes the resist pattern and the cross-linking layer.

In the method of the prior art, the resist pattern achieves some level of fineness. However, it is difficult to form the fine resist patterns that will be required in the future using this method of the prior art.

BRIEF SUMMARY OF THE INVENTION

According to an aspect of the present invention, there is provided a pattern forming method comprising: forming a first resist pattern on a substrate; irradiating light or energy beam on the first resist pattern; forming a resist film including a cross-linking material on the substrate and the first resist pattern; forming a second resist pattern including a cross-linking layer formed at an interface between the first resist pattern and the resist film by causing a cross-linking reaction at the interface of the first resist pattern and the resist film and the first resist pattern; and the irradiating light or energy beam on the first resist pattern including setting an amount of the light or energy beam irradiated on the first resist pattern such that a dimension of the second resist pattern is to be a predetermined dimension based on a previously prepared relationship between a difference between a dimension relating to the first resist pattern and a dimension relating to the second resist pattern and the amount of the light or energy beam irradiated on the first resist pattern.

According to another aspect of the present invention, there is provided a pattern forming method comprising: forming a first resist pattern on a substrate; performing a hydrophilic process for a surface of the first resist pattern; performing a hydrophobic process for a surface of the substrate; forming a resist film including a cross-linking material on the substrate and the first resist pattern; and forming a second resist pattern including a cross-linking layer formed at an interface between the first resist pattern and the resist film by causing a cross-linking reaction at the interface of the first resist pattern and the resist film and the first resist pattern.

According to an aspect of the present invention, there is provided a method for manufacturing a semiconductor device comprising: forming a first resist pattern on a substrate including semiconductor; irradiating light or energy beam on the first resist pattern; forming a resist film including a cross-linking material on the substrate and the first resist pattern; forming a second resist pattern including a cross-linking layer formed at an interface between the first resist pattern and the resist film by causing a cross-linking reaction at the interface of the first resist pattern and the resist film and the first resist pattern; the irradiating light or energy beam on the first resist pattern including setting an amount of the light or energy beam irradiated on the first resist pattern such that a dimension of the second resist pattern is to be a predetermined dimension based on a previously prepared relationship between a difference between a dimension relating to the first resist pattern and a dimension relating to the second resist pattern and the amount of the light or energy beam irradiated on the first resist pattern; and etching the substrate using the second resist pattern as a mask.

According to another aspect of the present invention, there is provided a method for manufacturing a semiconductor device comprising: forming a first resist pattern on a substrate including semiconductor; performing a hydrophilic process for a surface of the first resist pattern; performing a hydrophobic process for a surface of the substrate; forming a resist film including a cross-linking material on the substrate and the first resist pattern; and forming a second resist pattern including a cross-linking layer formed at an interface between the first resist pattern and the resist film by causing a cross-linking reaction at the interface of the first resist pattern and the resist film and the first resist pattern; and etching the substrate using the second resist pattern as a mask.

DETAILED DESCRIPTION OF THE INVENTION

Embodiments of the present invention will be described in detail in the following with reference to the drawings.

FIRST EMBODIMENT

Figure 1:
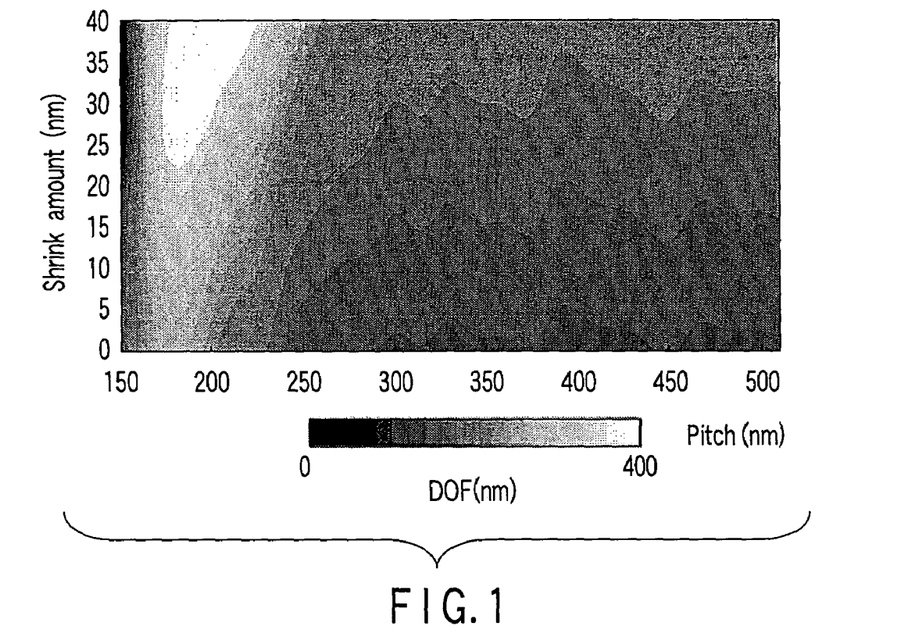
FIG. 1 shows the relationship between pitch, shrink amount and DOF.

FIG. 1 shows the relationship between pitch and shrink amount and DOF (Depth of Focus). More specifically, under conditions where the light source is ArF light, NA=0.9, σ=0.95, zonal shielding rate=0.5, and the mask dimension is ±3 nm, when the contact hole pattern that is formed from a plurality of contact holes (with a square shape and the dimension for each side being 90 nm), the pitch between the contact holes in the horizontal axis, and the shrink amount of the contact holes in the vertical axis is taken, and the DOF when the exposure amount is off by 2% is calculated using the photolithography simulation. It is seen from FIG. 1 that the optimal shrink amount due to the pitch varies.

In order to describe this in further detail, in case that required DOF is 150 nm, and the pitch is between 150 nm and 240 nm, it is not necessary to shrink the contact hole pattern. When the pitch is 150 nm in particular, the DOF reduces as the shrink amount increases and thus shrinking is unnecessary. Also, when the pitch exceeds 240 nm, in order to obtain a DOF of 150 nm, a shrink amount of at least 10 nm is necessary.

Figure 2:
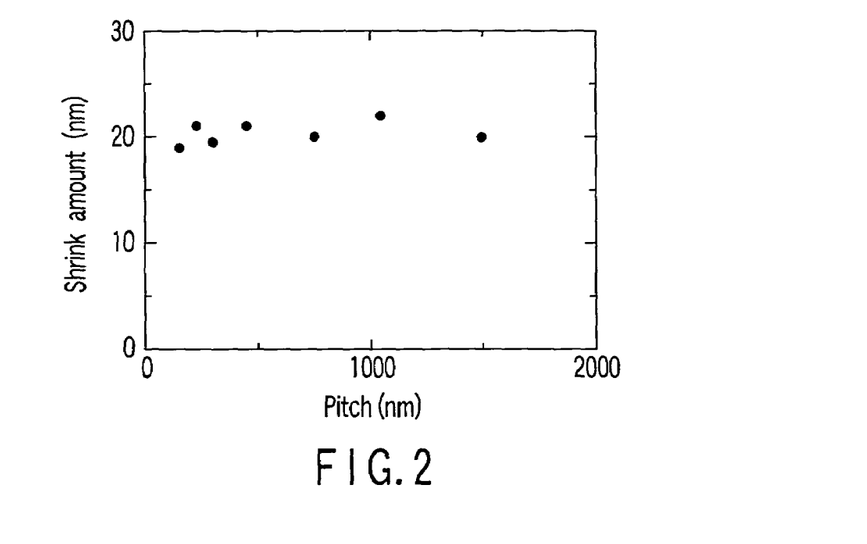
FIG. 2 shows the dependency of shrink amount on pitch.

FIG. 2 shows the dependency of shrink amount on pitch in the pattern forming method (shrink process) including: a step of forming a first resist pattern on a substrate to be processed using normal photolithography techniques; a step of forming the resist film including a cross-linking material on the first resist pattern and on the substrate; and a step of forming a resist pattern (shrink resist pattern) including the first resist pattern and a cross-linking layer by causing a cross-linking reaction on an interface between the first resist pattern and the resist. From FIG. 2, it can be seen that the shrink amount is independent of pitch, and is constant.

In the case where the pattern forming method (shrink process) is used, because the shrink amount is constant and independent of pitch, the DOF of the contact hole patterns with a pitch other than 150 nm can be increased by shrinking. However, the DOF of the contact hole pattern for which the pitch is 150 nm is reduced by shrinking, and the required DOF of 150 nm cannot be reached and thus it is difficult to form the required fine pattern. The pattern forming method of embodiments of the present invention which solves this type of problem will be described in the following.

Figure 3:
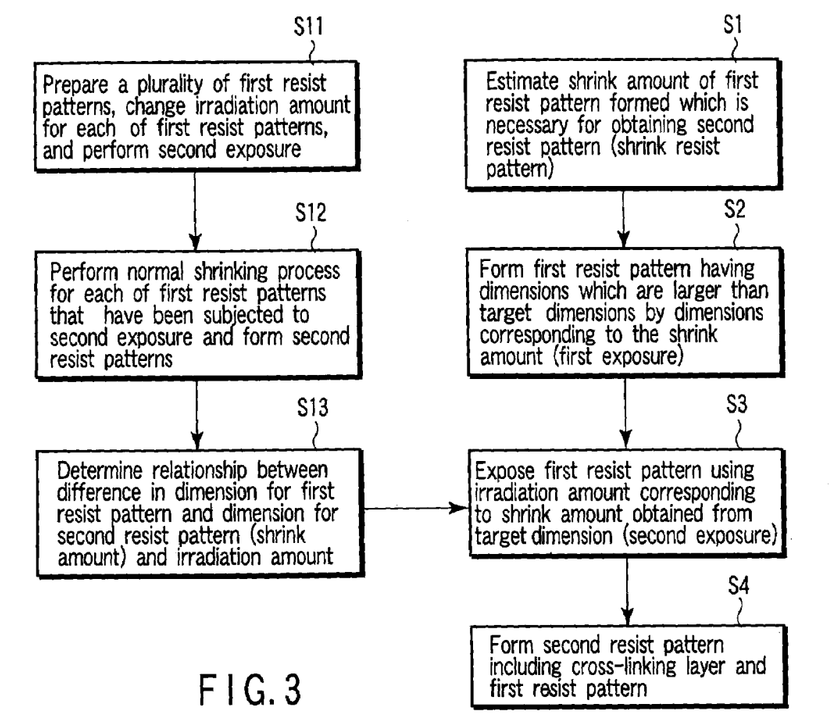
FIG. 3 is a flowchart showing the flow of a pattern forming method relating to the first embodiment of the present invention.

FIG. 3 is a flow chart showing the flow of a pattern forming method according to the first embodiment of the present invention.

Firstly, the shrink amount of the resist pattern (first resist pattern) formed on the substrate to be processed which is necessary for obtaining the shrink resist pattern (second resist pattern) is estimated by photolithography simulation (step S1). The shrink amount is estimated considering a margin of the lithography process.

Next, the first resist pattern having dimensions which are larger than the target dimensions (design dimensions) by dimensions corresponding to the shrink amount is formed on the substrate by known lithography techniques (step S2). The step for forming the first resist pattern comprises the step of forming a resist film on the substrate, a step of exposing the resist film (first exposure), a step of developing the exposed resist and etc.

A concrete example of step S2 will be described with reference to FIG. 4 to FIG. 6.

Figure 4:
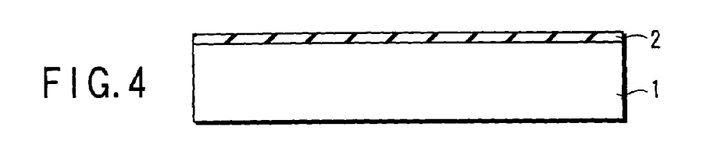
FIG. 4 is a cross-sectional diagram showing the pattern forming method according to the first embodiment of the present invention.

First as shown in FIG. 4, an antireflection film material is coated on the substrate to be processed 1 using the spin coating method, thereafter, baking is done for 1 minute at a temperature of 215° C., and an antireflection film 2 with a thickness of 80 nm is formed. The antireflection film material used herein is an ArF organic antireflection film ARC 29A manufactured by Nissan Chemical Industries Ltd. Also, a silicone substrate and a substrate including an insulation film which is formed thereon are used as the substrate 1.

Figure 5:
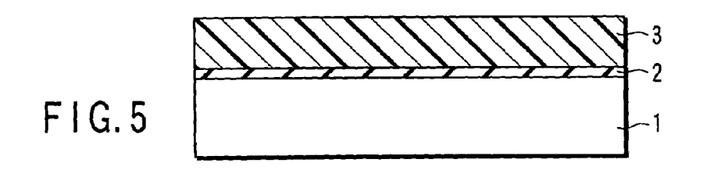
FIG. 5 is a cross-sectional diagram showing the pattern forming method according to the first embodiment of the present invention following the step of FIG. 4.

Next, as shown in FIG. 5, a positive resist is coated on the antireflection film 2 by spin coated method, thereafter, then baking is done for 1 minute at a temperature of 130° C., and an resist film with a thickness of 400 nm is formed. The ArF positive resist manufactured by JSR is used as the positive resist.

Figure 6:
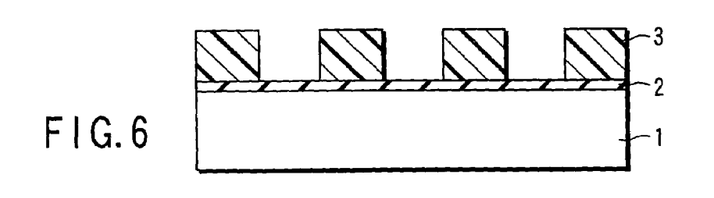
FIG. 6 is a cross-sectional diagram showing the pattern forming method according to the first embodiment of the present invention following the step of FIG. 5.

Next, as shown in FIG. 6, an exposure step, a baking step, and a development step are performed, and the first resist pattern 3 including a contact hole pattern is formed. In the exposure step herein, an ArF excimer laser exposure apparatus (NSR S306C manufactured by Nikon) is used, and exposure is done under conditions where NA=0.78 and with ⅔ zonal illumination using a half tone mask with a 6% transmissivity. Also, the temperature is 100° C. and the baking time is 1 minute in the baking step. In the developing step, developing is done with a 2.38 weight percent aqueous solution of tetra methyl ammonium hydroxide (TMAH). The first resist pattern 3 including a contact hole pattern formed of square contact holes in which one side is 150 nm is obtained using this exposure step, baking step, and development step. The configuration of the contact hole does not have to be square and can also be round.

After step S2, an ArF excimer laser is irradiated on the first resist pattern such that the dimension of the second resist pattern (shrink pattern) is to be a predetermined dimension (the target dimension), and the second exposure is performed (step S3).

The irradiation amount of the ArF excimer laser (the irradiation amount at the time of the second exposure of the first resist pattern) is determined based on a previously prepared relationship between the difference in the dimensions relating to the first resist pattern and the dimensions relating to the second resist pattern (shrink amount herein) and the irradiation amount (exposure amount).

The second exposure can be divided into a plurality of exposures. In that case, an irradiation amount at the time of each exposure is set such that the total of the irradiation amount at the time of each exposure is the irradiation amount. In this exposure, as shown in FIG. 11, mask blanks with phase shifting films (phase shifters) $8_1$ to $8_6$ which have different transmissivities are provided on the glass substrate (Qz) 7, and a phase shifting film having the transmissivity which can obtain a predetermined irradiation amount is selected from among the phase shifting films $8_1$ to $8_6$, and ArF excimer laser is irradiated onto the first resist pattern via the selected phase shifting film.

In the mask blanks, the transmissivity of the phase shifting films $8_1$ to $8_6$ is changed by changing the thickness of the phase shifting films $8_1$ to $8_6$, but it is also possible to change the transmissivity by changing the material.

Figure 11:
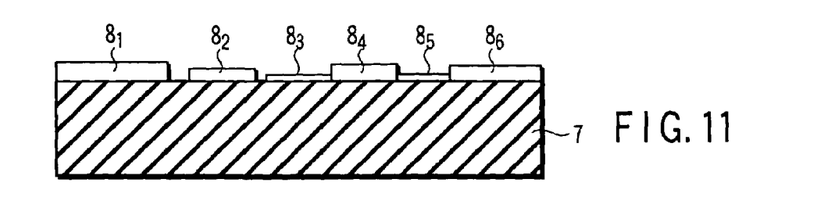
FIG. 11 is a cross-sectional diagram of mask blanks including phase shifting films (phase shifters) whose transmissivities are different respectively.

Furthermore, when the exposure is performed, by using the mask blanks having the plurality of phase shifting films with different transmissivities as shown in FIG. 11, light can be irradiated with a predetermined exposure amount on the plurality of regions in the resist with one exposure, and thus the TAT (Turn Around Time) can be shortened. The arrangement and thickness (transmissivity) of the plurality of phase shifting films is set so as to correspond with the arrangement and exposure amount of the plurality of regions in the resist. That is to say, the transmissivity and the arrangement of the phase shifting films (phase shifters) in the mask blanks are set such that the first resist pattern to be formed is obtained.

Next, a resist film including a cross-linking material is formed on the substrate to be processed and on the second resist pattern, thereafter, a cross-linking reaction is caused to occur at the interface of the first resist pattern and the resist film including the cross-linking material, to thereby form a cross-linking layer at the interface between the first resist pattern and the resist film including the cross-linking material, further, the second resist pattern including the cross-linking layer and the first resist pattern is formed via the rinse developing step. (step S4). The cross-linking layer reacts with acid.

A concrete example of step S4 will be described with reference to FIGS. 7 to 9.

Figure 7:
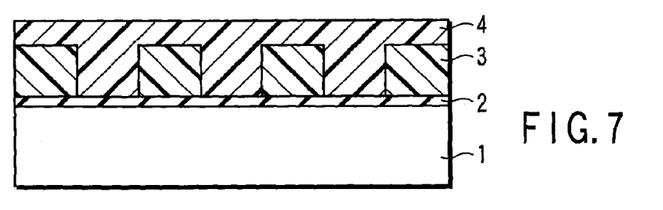
FIG. 7 is a cross-sectional diagram of a concrete example of step S4 of the pattern forming method according to the first embodiment of the present invention.

First, as shown in FIG. 7, RELACS agent manufactured by Clariant Japan is coated by the spin coating method onto the antireflection film 2 and the first resist pattern 3 which has been subjected to the second exposure, and a resist film 4 including the cross-linking material which is made from the RELACS agent and has a thickness of 300 nm is formed.

Figure 8:
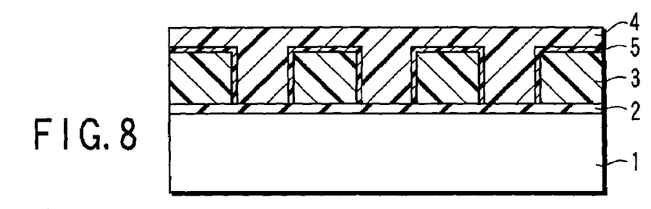
FIG. 8 is a cross-sectional diagram of a concrete example of step S4 of the pattern forming method according to the first embodiment of the present invention following the step of FIG. 7.

Next, as shown in FIG. 8, a cross-linking reaction is caused to occur at the interface between the first resist pattern 3 and the resist film 4 by baking for 90 seconds at 125° C. to thereby form a cross-linking layer 5 at the interface between the first resist pattern 3 and the resist film 4. Consequently, the second resist pattern 6 including the cross-linking layer 5 and the first resist pattern 3 is formed.

Figure 9:
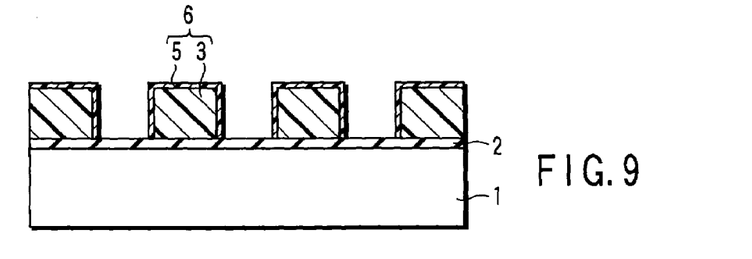
FIG. 9 is cross-sectional diagram of a concrete example of step S4 of the pattern forming method according to the first embodiment of the present invention following the step of FIG. 8.

Thereafter, as shown in FIG. 9, the resist film 4 is removed by performing rinse development in purified water for 60 seconds.

A method (steps S11 to S13) for obtaining the above-described relationship is described in the following.

First, a plurality of first resist patterns are prepared, and the irradiation amount is changed for each of the first resist patterns, and the second exposure is performed (step S11). The first exposure is the exposure that was performed when forming the first resist pattern. The first resist pattern has a plurality of patterns arranged with the constant pitch. The plurality of patterns is, for example, a pattern with a plurality of openings corresponding to the plurality of contact holes.

Next, a normal (known) shrinking process is performed for each of the first resist patterns that have been subjected to the second exposure, and a plurality of second resist patterns are formed (step S12).

Next, the difference between the dimension relating to the first resist pattern and the dimension relating to the second resist pattern (shrink amount herein) is determined, thereafter, the relationship between the shrink amount and the irradiation amount is determined (step S13). The dimensions relating to the first and second resist patterns is, for example, the length of one side of the square contact hole or the length of the long side of the rectangular contact hole.

The steps S11 to S13 are also carried out for the other resist patterns obtained by changing the pitch of plurality of patterns included in the first resist pattern. The relationship that is referred in step S3 is related to a resist pattern having a plurality of patterns with the same pitch as the plurality of patterns included in the first resist pattern formed in steps S1 to S4.

Next, a concrete example of a method (steps S11 to S13) for determining the relationship will be described. In the following description, step S11 includes steps S11A to S11D, and step S12 includes steps S12A to S12D.

First, a plurality of semiconductor substrates (wafers) are prepared (step S11A). The semiconductor substrate is, for example, a silicone substrate (silicone wafer).

Next an antireflection film material is coated onto the semiconductor substrate by spin coating method, thereafter, baked for 1 minute at 215° C. to form an antireflection film with a thickness of 80 nm on the semiconductor substrate (step S11B). The antireflection film material used herein is ArF organic antireflection film ARC 29A manufactured by Nissan Chemical Industries Ltd.

Next, a positive resist is coated onto the antireflection film by spin coating method, thereafter, baked for 1 minute at a temperature of 130° C. to form a resist film with a thickness of 400 nm (step 11C). The ArF positive resist manufactured by JSR is used as the positive resist.

Next, the exposure (first exposure) step, the baking step and the developing step are performed, and the resist film having a contact hole pattern (first resist pattern) is formed (step S11D).

In the exposure step herein, an ArF excimer laser exposure apparatus (NSR S306C manufactured by Nikon) is used, and exposure is done under conditions where NA=0.78 and with 2/3 zonal illumination using a half tone mask with a 6% transmissivity. Also, in the baking step, the temperature is 100° C. and the baking time is 1 minute. In the developing step, developing is done with a 2.38 weight percent aqueous solution of tetra methyl ammonium hydroxide (TMAH). The first resist pattern including a contact hole pattern of 150 nm is obtained using this type of exposure step, baking step, and development step.

After step S11, (S11A to S11D), the shrink process S12 (S12A to 12D) follows.

First, the ArF excimer laser exposure apparatus (NSR S306C manufactured by Nikon) is used, and the second exposure is done for the first resist pattern under conditions where NA=0.78 and with 2/3 zonal illumination and the irradiation amount is changed for each semiconductor substrate (step S12A).

Next, RELACS agent manufactured by Clariant Japan is coated by spin coating method onto the antireflection film and the first resist pattern 3 which has been subjected to the second exposure, and a resist film including the cross-linking material which is made from the RELACS agent and has a thickness of 300 nm is formed (step S12B).

Next, a cross-linking reaction is caused to occur at the interface between the first resist pattern and the resist film including the cross-linking material by baking for 90 seconds at 125° C. to thereby form a cross-linking layer at the interface between the first resist pattern and the resist film including the cross-linking material (step S12C).

Next, by performing rinse development in purified water for 60 seconds, the second resist pattern including the cross-linking layer and the first resist pattern 3 is obtained (step S12D).

Figure 10:
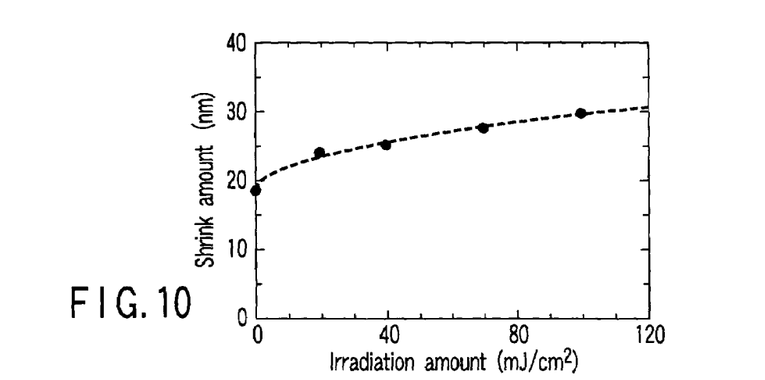
FIG. 10 shows the relationship between the irradiation amount of the first resist pattern and the shrink amount at the time of the second exposure in the pattern forming method according to the first embodiment of the present invention.

Thereafter, the dimension of the contact hole in the second resist pattern is measured by a S-9220 length measuring SEM manufactured by Hitachi for each of the plurality of semiconductor substrates (wafers), and the relationship between the irradiation amount of the first resist pattern at the time of the second exposure and the shrink amount is obtained as shown in FIG. 10. (step S13).

The above steps S11A to 11D, S12A to 12D and S13 is also carried out for other resist patterns obtained by changing the pitch of the plurality of patterns in the first resist pattern.

In the present embodiment, when the first resist pattern is exposed, light (laser light) is irradiated, but energy beams such as electron beam, I ray, G ray, or soft X ray (EUV) can be used. In this case, the material of the resist pattern is suitably changed in accordance with the energy beam to be irradiated.

A semiconductor device including a fine pattern such as a contact hole which overcomes the limitation of wavelength can be realized by etching the substrate to be processed using the second resist pattern obtained by the pattern forming method of the present embodiment as a mask.

SECOND EMBODIMENT

Figure 12:
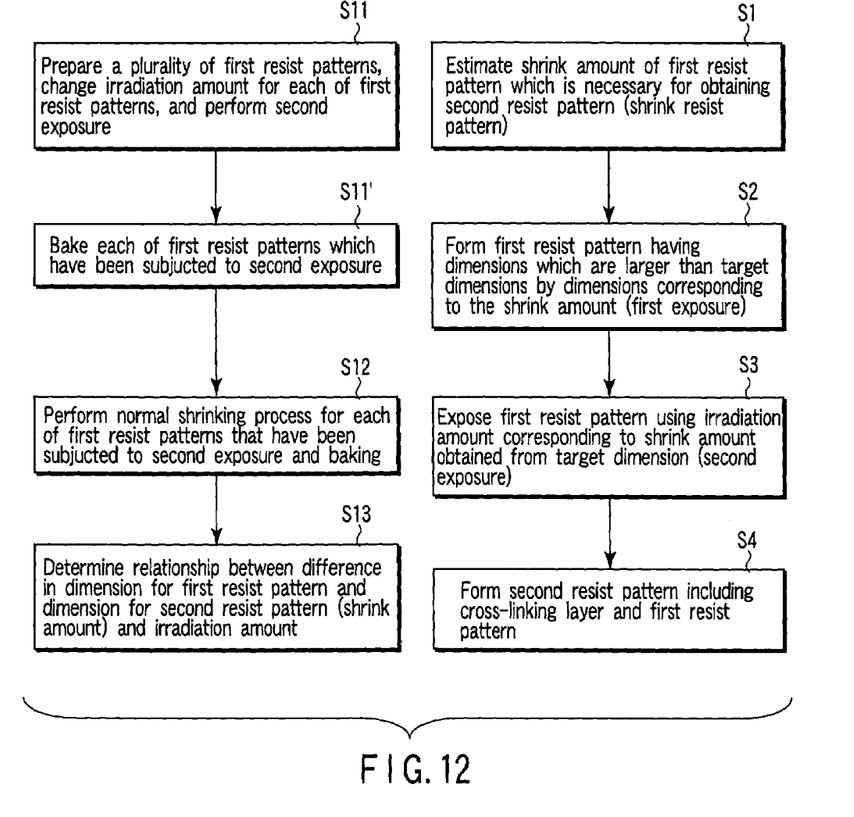
FIG. 12 is a flowchart showing the flow of a pattern forming method according to the second embodiment of the present invention.

FIG. 12 is a flowchart showing the flow of the pattern forming method of the second embodiment of the present invention. The parts which correspond to those of FIG. 3 will be assigned the same reference numerals and detailed descriptions thereof (including effects, modifications and the like) will not be repeated.

The present embodiment differs from the first embodiment in that after step S11, each of the first resist patterns which have been subjected to the second exposure are baked (step S11'). Step S11' is performed before step S12.

More specifically, in step S11', baking is done for 1 minute at a temperature of 100° C. Concrete examples of steps S11, S12, and S13 in the present embodiment are the same as those of the first embodiment. In the case where in step S11', baking is done at 100° C. for 1 minute, and steps S1 to S4 are the same as the first embodiment, the relationship between the irradiation amount of the first resist pattern and the shrink amount which is obtained, is as shown in FIG. 13.

Figure 13:
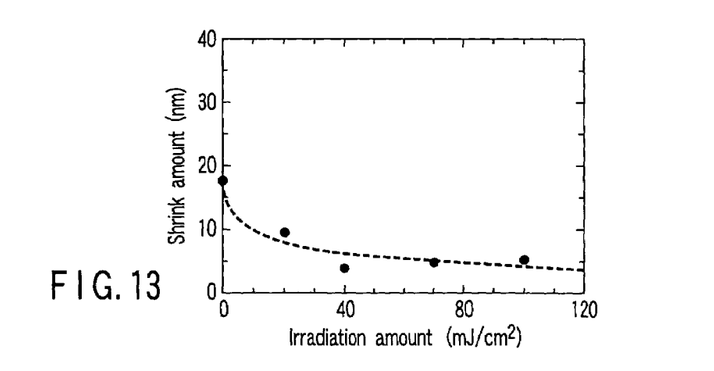
FIG. 13 is a flowchart showing the flow of the pattern forming method according to the second embodiment of the present invention.

According to the present embodiment, by adding step S11', as shown in FIG. 13, the relationship between irradiation amount of the first resist pattern and the shrink amount can be obtained for the case where the shrink amount decreases as the irradiation amount increases. However, in the first embodiment, as shown in FIG. 10, the relationship between irradiation amount and the shrink amount of the first resist pattern can be obtained for the case where the shrink amount increases as the irradiation amount increases.

Also, the control range for the shrink amount obtained from FIG. 10 is about 10 nm, and similarly, the control range for the shrink amount obtained from FIG. 13 is about 10 nm. However, by using the relationship between irradiation amount of the first resist pattern at the time of the second exposure and the shrink amount which is obtained by combining FIG. 10 and FIG. 13, the control range for the shrink amount can be expanded to about 20 nm (about double).

A semiconductor device including a fine pattern such as a contact hole which overcomes the limitation of wavelength can be realized by etching the substrate to be processed using the second resist pattern obtained by the pattern forming method of the present embodiment as a mask.

THIRD EMBODIMENT

FIGS. 14 to 20 are cross-sectional diagrams showing the pattern forming method of the third embodiment of the present invention. The pattern forming method of the present embodiment is a pattern forming method for a three layer resist process.

Figure 14:
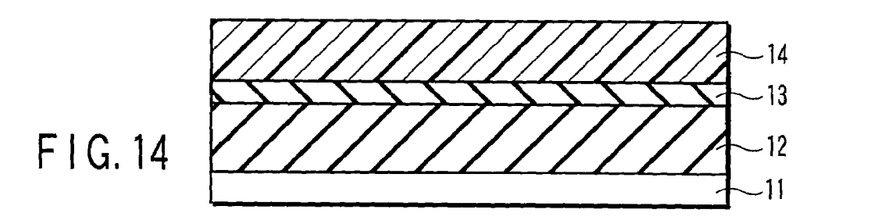
FIG. 14 is a cross-sectional diagram showing a pattern forming method according to the third embodiment of the present invention.

First, as shown in FIG. 14, an antireflection film 12, a SOG film 13 and the chemically amplified resist film 14 are sequentially formed by rotation coating method on a main surface of the substrate 11.

The substrate 11 comprises, for example, a semiconductor substrate such as silicon substrate on which the elements are integrated, or a wire layer (wire and insulation film) which is provided on the semiconductor substrate. In the case that a contact hole pattern is to be formed, the insulation film is processed. Hereinafter, the substrate 11 and the films formed thereon (the antireflection film 12, the SOG film 13 and the chemically amplified resist film 14 at this stage) together will be called the substrate to be processed.

Also, a Spun-on C film made from carbon is used as the antireflection film 12; an organic silicon oxide film is used as the SOG film 13; and ArF light (wavelength 193 nm) chemical amplifying positive resist film is used as the chemically amplified resist film 14.

Figure 15:
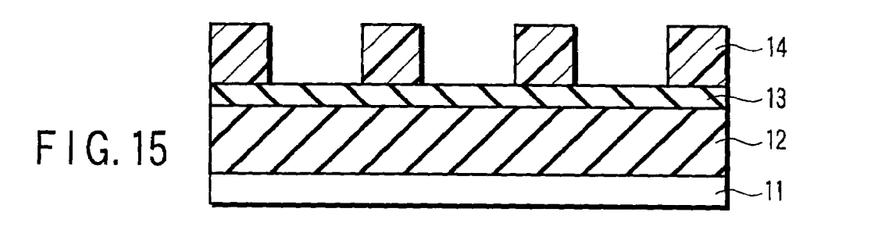
FIG. 15 is a cross-sectional diagram showing the pattern forming method according to the third embodiment of the present invention following the step of FIG. 14.

Next, as shown in FIG. 15, the first resist pattern 14 with a hole diameter of 150 nm is formed via the exposure step, the baking step, the development step, and the drying step.

In the exposure step herein, the chemically amplified resist film 14 is irradiated by the ArF excimer laser via a exposure reticle, and a pattern in the exposure reticle is projected on the chemically amplified resist film 14 by reduction exposure. In the baking step, heating is done for 60 seconds at 130° C. Thereafter, the substrate 11 is transported to the developing apparatus. In the developing apparatus, developer is supplied on the substrate to be processed, and the development process is carried out for 30 seconds. After the development process, purified water is supplied on the substrate to be processed while the substrate is being rotated, and thus the reaction is stopped and washing is done. Thereafter, the substrate to be processed is dried by spin drying.

Figure 16:
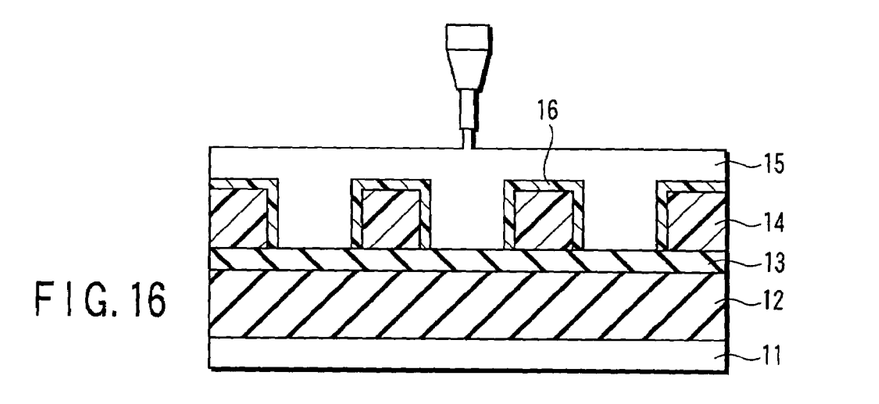
FIG. 16 is a cross-sectional diagram showing the pattern forming method according to the third embodiment of the present invention following the step of FIG. 15.

Next, as shown in FIG. 16, ozone water 15 is supplied on the SOG film 13 and the first resist pattern 14. The surface of the first resist pattern 14 is made hydrophilic by the ozone water 15. The hydrophilic region is shown by the reference numeral 16.

The ozone water 15 herein has a concentration of 20 ppm and is supplied for 60 seconds. Furthermore, ozone water 15 is supplied on substrate to be processed in order to cause the surface of the first resist pattern 14 to be uniformly hydrophilic.

Even if ozone water 15 is supplied on the SOG film 13, the most of the surface of SOG film 13 will not become hydrophilic. Thus, in the case of the present embodiment, the first resist pattern 14 can be made selectively hydrophilic on the main surface of the substrate 11.

Figure 17:
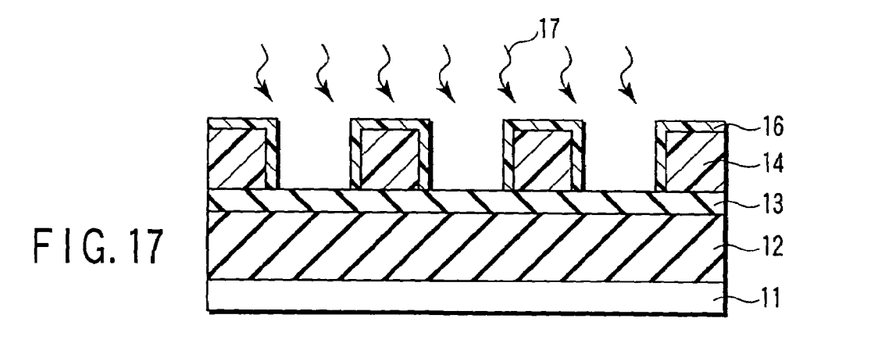
FIG. 17 is a cross-sectional diagram showing the pattern forming method according to the third embodiment of the present invention following the step of FIG. 16.

Next, as shown in FIG. 17, the substrate to be processed is heated for 30 seconds at 100° C. in a processing device (not shown) which has been filled with hexamethyldisilazane vapor 17, and the surface of the SOG film 13 is made hydrophobic. At this time, the region 16 of the first resist pattern 14 which is made hydrophilic rarely becomes hydrophobic, and the hydrophilic characteristic of the region 16 is maintained. Thus in the case of the present embodiment, the surface of the SOG film 13 is made selectively hydrophobic on the main surface of the substrate 11.

Figure 18:
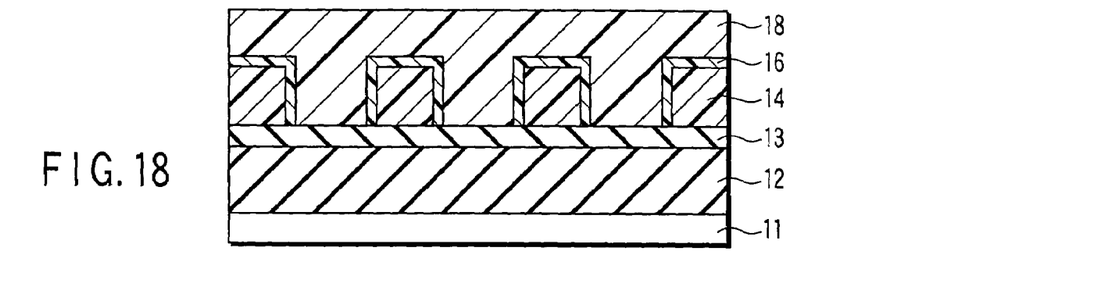
FIG. 18 is a cross-sectional diagram showing the pattern forming method according to the third embodiment of the present invention following the step of FIG. 17.

Next, as shown in FIG. 18, a resist film 18 which is formed from a soluble resin including a cross-linking material is formed on the SOG film 13 and the first resist pattern 14 such that the surface of the first resist pattern 14 is covered. The cross-linking material reacts with acid.

Figure 19:
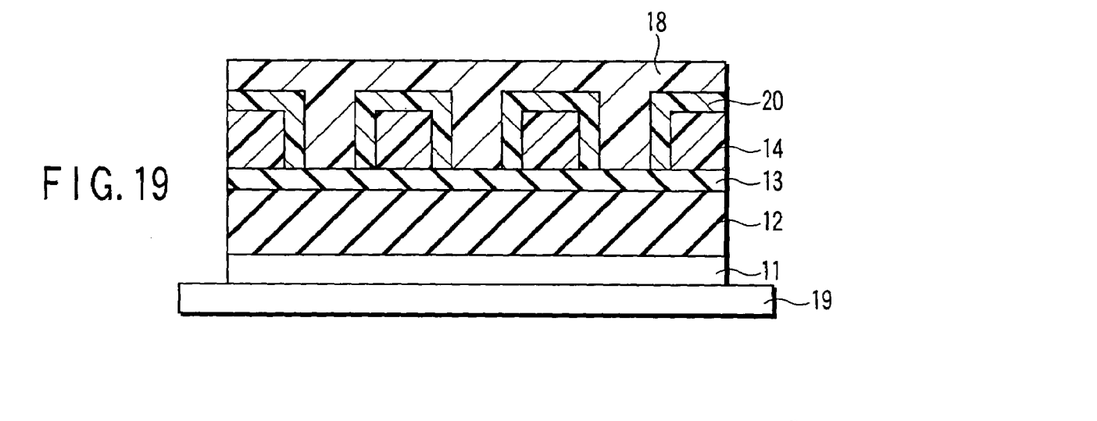
FIG. 19 is a cross-sectional diagram showing the pattern forming method according to the third embodiment of the present invention following the step of FIG. 18.

Next, as shown in FIG. 19, the substrate is mounted on a heating plate 19 with the resist film 18 is placed up, thereafter, a cross-linking layer 20 is formed at an interface between the first resist pattern 14 and the resist film 18 by causing a cross-linking reaction at the interface between the first resist pattern 14 and the resist film 18 by heat treatment of 60 seconds, 130° C. At this time, the surface of the SOG film 13 has been made hydrophobic, and thus the cross-linking layer is prevented from being formed between the SOG film 13 and the resist film 18.

Figure 20:
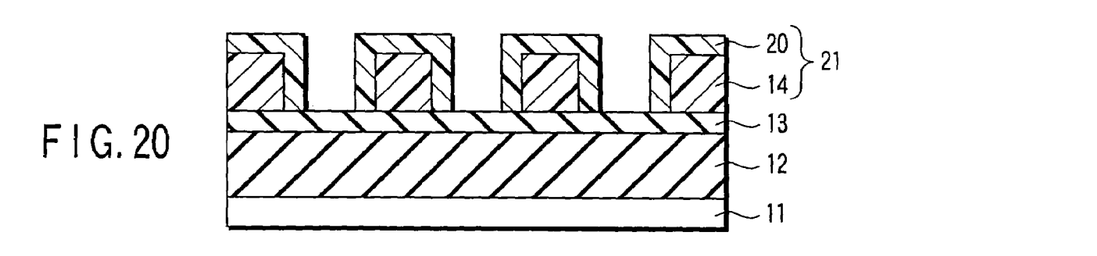
FIG. 20 is a cross-sectional diagram showing the pattern forming method according to the third embodiment of the present invention following the step of FIG. 19.

Next, as shown in FIG. 20, the resist film 18 which has not been cross-linked with the first resist pattern 14 is removed by supplying water on the substrate. In this manner, the second resist pattern 21 which includes the first resist pattern 14 and the cross-linking layer 20 is obtained.

The hole diameter of the second resist pattern 21 of the present embodiment is surveyed. The result showed that the hole diameter is 115 nm and the shrink amount of the hole is 35 nm (150 nm to 115 nm). As a comparative example, suppose that the hydrophobic treatment of FIG. 17 was not performed, because a cross-linking layer is also formed between the SOG and the soluble resin, the bottom portion of the second resist pattern is embedded and the pattern shape is not rectangular, and in the next step, an etching is performed using the second resist pattern as a mask, the predetermined processing cannot be performed. As the results, according to the present embodiment, a pattern formation method with a large shrink amount is obtained, and thus the fine resist pattern that will be required in the future can be easily formed.

In the present embodiment, ozone water is used as the chemical for hydrophilic treatment of the surface of the first resist pattern 14. However, the chemical for hydrophilic treatment of the surface of the resist is not to be limited to ozone water. Basically, any oxidizing liquid can be used as the chemical. For example, hydrogen peroxide solution is effective in making the resist surface hydrophilic because of its oxidizability.

In addition, in the present embodiment, the conditions for the hydrophilic treatment using the ozone water 15 are an ozone concentration of 20 ppm and a supply time of 60 seconds, but the process conditions are not to be limited to the process conditions of the present embodiment. The reactivity of the ozone water 15 differs depending on the type of first resist pattern 14. For this reason, the optimal condition for the process should be suitably selected in accordance with type of the first resist pattern 14 and the resist film 18 which will be coated after being made hydrophilic or the required hole shrink amount.

In addition, in the present embodiment, water is used as the liquid for removing the resist film 18 that has not been cross-linked with the first resist pattern 14. However, the liquid for removing the portion of the resist film 18 that has not been cross-linked is not to be limited to water, for example, alkali chemicals such as TMAH and the like can be used.

In the present embodiment a chemically amplified resist which is reactive with ArF is used as the resist which will become the first resist pattern 14. However the chemically amplified resist is not to be limited thereto and the same effect can be obtained by using other alicyclic resins (acrylic resins, coma resins and hybrid resins). In addition, resins including aromatic compounds are also effective and I-ray and G-ray resists having Novolac resin, KrF resists formed from resins having a polyvinyl phenol structure, and resists for electron beam exposure, resist for soft ray (EUV) exposure and the like have also been found to be effective.

In the present embodiment, the case that the present invention is applied to the pattern forming method of the three layer resist process is explained, however, the present invention is applied to the pattern forming method of the two layer resist process.

Furthermore, a semiconductor device including a fine pattern such as a contact hole which overcomes the limitation of wavelength can be realized by etching the substrate to be processed using the second resist pattern obtained by the pattern forming method of the present embodiment as a mask.

FOURTH EMBODIMENT

FIGS. 21 to 25 are cross-sectional diagrams showing a pattern forming method of the fourth embodiment of the present invention. It is to be noted that the parts corresponding to the previous drawings will be assigned the same reference numerals, and detailed descriptions thereof will not be repeated.

Figure 21:
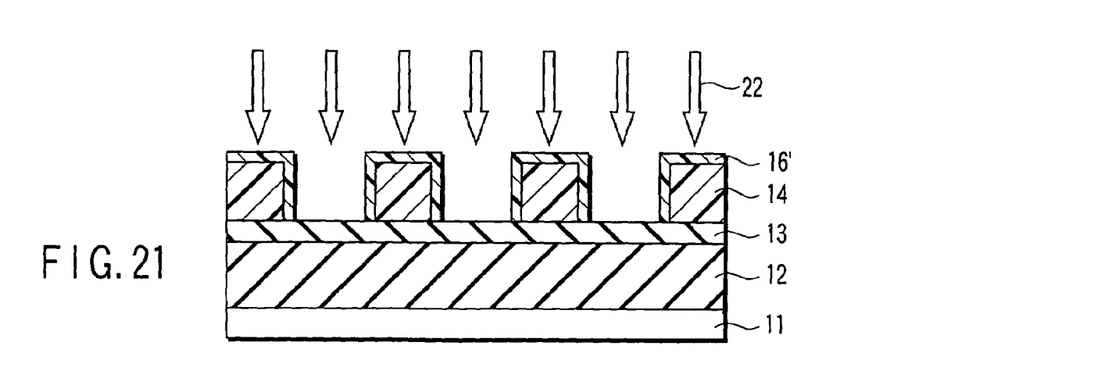
FIG. 21 is a cross-sectional diagram showing a pattern forming method according to the fourth embodiment of the present invention.

First, as shown in FIG. 21, as is the case for the third embodiment, the antireflection film 12, the SOG film 13 and the first resist pattern 14 are formed on the main surface of the substrate 11, thereafter, the first resist pattern 14 is irradiated with $Xe_2$ excimer lamp light 22 with a wavelength of 172 nm in the presence of nitrogen gas containing oxygen. The surface of the first resist pattern 14 is made hydrophilic by the $Xe_2$ excimer lamp light. The region that was made hydrophilic is shown by the reference numeral 16'.

When the $Xe_2$ excimer lamp light 22 is irradiated, the light source for the $Xe_2$ excimer lamp light 22 is disposed at a position which is a distance of 1 mm away from the substrate to be processed, and lamp output of the light source is set at 5 mW/cm$^2$ and the irradiation time is set at 5 seconds, and the $Xe_2$ excimer lamp light 22 evenly irradiated on the entire surface of the substrate to be processed. By irradiating $Xe_2$ excimer lamp light 22 with a wavelength of 172 nm in the presence of nitrogen gas containing oxygen onto the first resist pattern 14, ozone is generated from the oxygen, and the surface of the first resist pattern 14 is made hydrophilic by the ozone gas.

Figure 22:
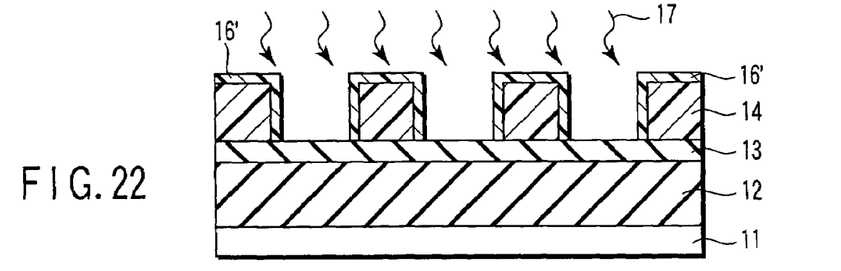
FIG. 22 is a cross-sectional diagram showing the pattern forming method according to the third embodiment of the present invention following the step of FIG. 21.

Next, as shown in FIG. 22, the substrate to be processed is subjected to heat treatment for 30 seconds at 100° C. in a processing apparatus (not shown) which has been filled with hexamethyldisilazane vapor 17 and the surface of the SOG film 13 is made hydrophobic. At this time, the region 16' of the first resist pattern 14 which was made hydrophilic rarely becomes hydrophobic, and the hydrophilic characteristic of the region 16' is maintained. Thus in the case of the present embodiment, the surface of the SOG film 13 is made selectively hydrophobic on the main surface of the substrate 11.

Figure 23:
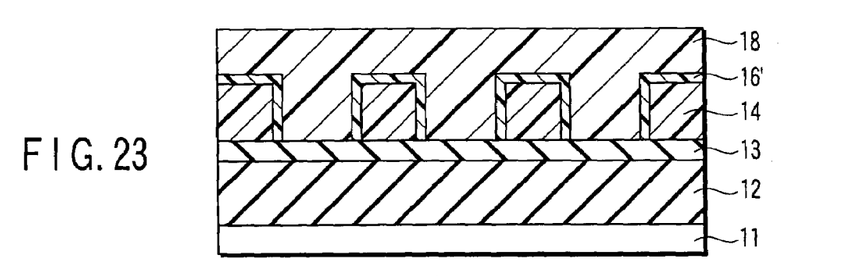
FIG. 23 is a cross-sectional diagram showing the pattern forming method according to the third embodiment of the present invention following the step of FIG. 22.

Next, as shown in FIG. 23, the resist film 18 which is formed from a soluble resin including the cross-linking material is formed on the SOG film 13 and the first resist pattern 14 such that the surface of the first resist pattern 14 is covered.

Figure 24:
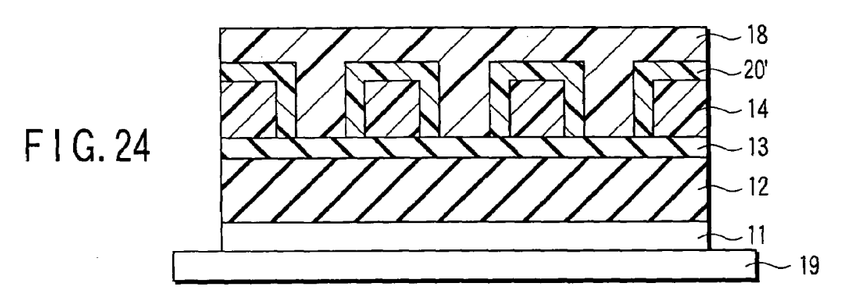
FIG. 24 is a cross-sectional diagram showing the pattern forming method according to the third embodiment of the present invention following the step of FIG. 23.

Next, as shown in FIG. 24, the substrate 11 is mounted on the heating plate 19 with the resist film 18 is placed up, thereafter, a cross-linking layer 20 is formed at the interface between the first resist pattern 14 and the resist film 18 by causing the cross-linking reaction at the interface between the first resist pattern 14 and the resist film 18 by heat treatment of 60 seconds, 130° C.

Figure 25:
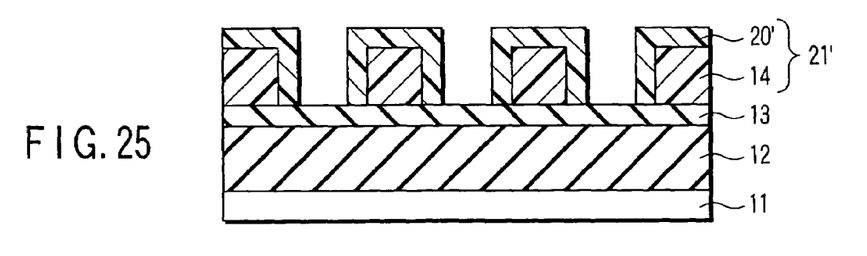
FIG. 25 is a cross-sectional diagram showing the pattern forming method according to the third embodiment of the present invention following the step of FIG. 24.

Next, as shown in FIG. 25, the resist layer 18 which has not been cross-linked with the first resist pattern 14 is removed by supplying water on the substrate 11. The second resist pattern 21' which includes the first resist pattern 14 and the cross-linking layer 20' is obtained in this manner.

The hole diameter of the second resist pattern 21' of the present embodiment is checked. The result showed that the hole diameter is 110 nm and the shrink amount of the hole is 40 nm (150 nm to 110 nm).

In the present embodiment, the light irradiation (laser light irradiation) for making the surface of the first resist pattern 14 hydrophilic is a $Xe_2$ excimer lamp light with the wavelength of 172 nm in the presence of nitrogen gas including oxygen. However, the light for making the surface of the resist hydrophilic is not limited to the excimer lamp light with the wavelength of 172 nm. Basically, any light that can make the resist surface hydrophilic can be used and examples of the light source include excimer lamp light or excimer laser light of $Ar_2$ (126 nm wavelength) and $Kr_2$ (146 nm wavelength). Furthermore, depending on the material thereof, the first resist pattern 14 can be made hydrophilic by irradiation of energy beam such as electron beam, I ray, G ray, soft X-ray (EUV) and the like.

Furthermore, in the present embodiment, light irradiation is performed with the lamp output of the light source being 5 mW/cm$^2$ and the light source being positioned at a distance of 1 mm from the substrate to be processed, but the reactivity to lamp light differs depending on the type of the first resist pattern 14. For this reason, the optimal condition of the process such as the lamp output of the light source, the lamp irradiation time and the distance from substrate to be processed should be suitably selected in accordance with type of the first resist pattern 14 and the resist film which has been coated after being made hydrophilic or the required hole shrink amount.

In the present embodiment a chemically amplified resist which is reactive with ArF is used as the resist which will become the first resist pattern 14. However the chemically amplified resist is not to be limited thereto and the same effect can be obtained by using other alicyclic resins (acrylic resins, coma resins and hybrid resins). In addition, resins including aromatic compounds are also effective and I-ray and G-ray resists having Novolac resin, KrF resists formed from resins having a polyvinyl phenol structure, and resists for electron beam exposure, resist for soft ray (EUV) exposure and the like have also been found to be effective.

In the present embodiment, the case that the present invention is applied to the pattern forming method of the three layer resist process is explained, however, the present invention is applied to the pattern forming method of the two layer resist process.

Furthermore, a semiconductor device including a fine pattern such as a contact hole which overcomes the limitation of wavelength can be realized by etching the substrate to be processed using the second resist pattern obtained by the pattern forming method of the present embodiment as a mask.

The embodiments of the present invention have been described above, but the invention is not to be limited by these embodiments. For example, the first embodiment and the third embodiment, the first embodiment and the fourth embodiment, the second embodiment and third embodiment, or the second embodiment and the fourth embodiment can be combined, and the combined embodiments can be performed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a first resist pattern on a substrate, the first resist pattern comprising a plurality of regions, the plurality of regions each including a plurality of first patterns which are arranged at a constant pitch, wherein the pitch of the plurality of first patterns differs for each of the plurality of regions;
    irradiating each of the plurality of regions with light or energy beams;
    forming a resist film including a cross-linking material on the substrate and the first resist pattern; and
    forming a second resist pattern including a plurality of second patterns corresponding to the plurality of first patterns, each of the plurality of second patterns including a cross-linking layer formed at an interface between the first resist pattern and the resist film by causing a cross-linking reaction at the interlace of the first resist pattern and the resist film, wherein irradiating each of the plurality of regions with light or energy beams includes setting an amount of light or energy beams for each of the plurality of regions such that each of dimensions of the plurality of second patterns is to be a predetermined dimension based on a previously prepared relationship between shrink amounts of dimensions of the plurality of second patterns with respect to dimensions of the plurality of first patterns and amounts of light or energy beams irradiated on the plurality of first patterns.

2. The pattern forming method according to claim 1, wherein irradiating each of the plurality of regions with light or energy beams includes preparing mask blanks which comprise a plurality of regions with different transmissivities;

selecting a region, from the plurality of regions of the mask blanks, having a transmissivity corresponding to the set amount of the light or energy beams irradiated on the plurality of regions; and irradiating each of the plurality of regions with light or energy beams via the selected region.

3. The pattern forming method according to claim 1 wherein irradiating each of the plurality of regions with light or energy beams includes preparing mask blanks which comprise a plurality of regions with different transmissivities; and irradiating each of the plurality of regions with light or energy beams via the plurality of regions on the mask blanks.

4. A method for manufacturing a semiconductor device comprising:

forming a first resist pattern on a semiconductor substrate, the first resist pattern comprising a plurality of regions, the plurality of regions each including a plurality of first patterns which are arranged at a constant pitch, wherein the pitch of the plurality of first patterns differs for each of the plurality of regions;

irradiating each of the plurality of regions with light or energy beams;

forming a resist film including a cross-linking material on the substrate and the first resist pattern;

forming a second resist pattern including a plurality of second patterns corresponding to the plurality of first patterns, each of the plurality of second patterns including a cross-linking layer formed at an interface between the first resist pattern and the resist film by causing a cross-linking reaction at the interface of the first resist pattern and the resist film; and etching the substrate using the second resist pattern as a mask, wherein irradiating each of the plurality of regions with light or energy beams includes setting an amount of light or energy beams for each of the plurality of regions such that dimensions of each of the plurality of second patterns is to be a predetermined dimension based on a previously prepared relationship between shrink amounts of dimensions of the plurality of second patterns with respect to dimensions of the plurality of first patterns and amounts of light or energy beams irradiated on the plurality of first patterns.

5. The method for manufacturing a semiconductor device according to claim 4, wherein irradiating the first resist pattern with light or energy beams includes preparing mask blanks which comprise a plurality of regions with different transmissivities;

selecting a region having a transmissivity corresponding to the set amount of light or energy beams irradiated on the first pattern from the plurality of regions of the mask blanks; and irradiating the first resist pattern with the light or energy beams via the selected region.

6. The method for manufacturing a semiconductor device according to claim 4, wherein irradiating the first resist pattern with light or energy beams on includes preparing mask blanks which comprise a plurality of regions with different transmissivities; and irradiating the first resist pattern with light or energy beams via the plurality of regions on the mask blanks.

* * * * *

UNITED STATES PATENT AND TRADEMARK OFFICE
CERTIFICATE OF CORRECTION

PATENT NO. : 7,527,918 B2 Page 1 of 1
APPLICATION NO. : 10/992349
DATED : May 5, 2009
INVENTOR(S) : Kondoh et al.

It is certified that error appears in the above-identified patent and that said Letters Patent is hereby corrected as shown below:

Claim 1, column 13, line 2, change "interlace" to --interface--.

Claim 3, column 13, line 26, change "claim 1" to --claim 1,--.

Signed and Sealed this

Fourteenth Day of July, 2009

JOHN DOLL
*Acting Director of the United States Patent and Trademark Office*